United States Patent [19]
Kingsley et al.

[11] Patent Number: 5,773,817
[45] Date of Patent: Jun. 30, 1998

[54] ULTRAFAST, HIGH VOLTAGE PULSER USING CIRCUMFERENTIALLY ILLUMINATED, LASER-SWITCHED RADIAL TRANSMISSION LINE

[75] Inventors: Lawrence E. Kingsley, Shrewsbury; Maurice Weiner, Ocean; Hardev Singh, Robbinsville, all of N.J.; William R. Donaldson, Pittsford, N.Y.

[73] Assignee: The United States of America as represented by the Secretary of the Army, Washington, D.C.

[21] Appl. No.: 712,786

[22] Filed: Sep. 12, 1996

[51] Int. Cl.[6] .................................................. H01J 40/14
[52] U.S. Cl. .................................... 250/214.1; 250/551
[58] Field of Search ........................... 250/214.1, 214 R, 250/551, 208.2, 208.4, 208.6; 257/4, 459, 82; 333/242; 342/13, 21, 202, 204; 343/895

[56] References Cited

U.S. PATENT DOCUMENTS

| | | | |
|---|---|---|---|
| 5,028,971 | 7/1991 | Kim et al. | 250/214.1 |
| 5,047,621 | 9/1991 | Weiner et al. | 250/208.4 |
| 5,146,075 | 9/1992 | Kim et al. | 250/214.1 |
| 5,155,352 | 10/1992 | Kim et al. | 250/214.1 |
| 5,177,486 | 1/1993 | Kim et al. | 250/214.1 |
| 5,262,657 | 11/1993 | Kim et al. | 250/214.1 |
| 5,280,168 | 1/1994 | Kim et al. | 250/214.1 |
| 5,283,584 | 2/1994 | Kim et al. | 250/214.1 |
| 5,319,218 | 6/1994 | Kim et al. | 250/214.1 |
| 5,382,788 | 1/1995 | Kim et al. | 250/214.1 |

OTHER PUBLICATIONS

Auston, D.H., "Picosecond Optoelectronic Switching and Gating in Silicon", Appl. Phys. Lett. 26, pp. 101–103, 1975.

*Primary Examiner*—Edward P. Westin
*Assistant Examiner*—John R. Lee
*Attorney, Agent, or Firm*—Michael Zelenka; George B. Tereschuk

[57] ABSTRACT

A pulse signal generator apparatus for producing an ultrafast, high-voltage pulser using a circumferentially illuminated, laser-switched radial transmission line transformer. The apparatus includes a radial transmission line transformer having a circular plate structure which can be coupled to a voltage source that becomes conductive upon the application thereto of a predetermined type of light energy. A laser switching device which is integral with the radial transmission line transformer and surrounds the circular plate structure, operates to switch an input electrical pulse of a predetermined peak voltage, injected at a circumferential edge of the circular plate structure onto a peripheral surface of the circular plate structure, to produce an output electrical pulse having a substantially higher peak voltage than the predetermined peak voltage of the input electrical pulse, at a center of the circular plate structure of the transmission line transformer. The apparatus also includes a laser for producing the predetermined type of light energy which illuminates the laser switching device.

21 Claims, 9 Drawing Sheets

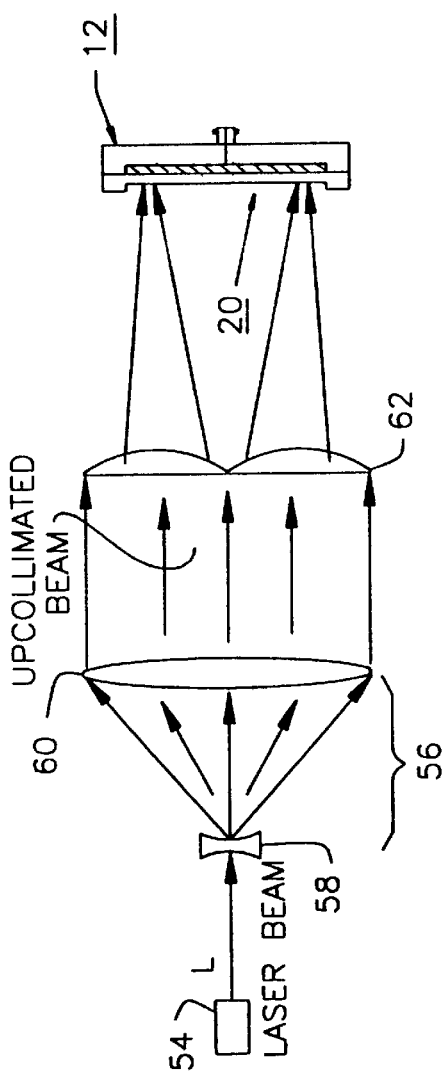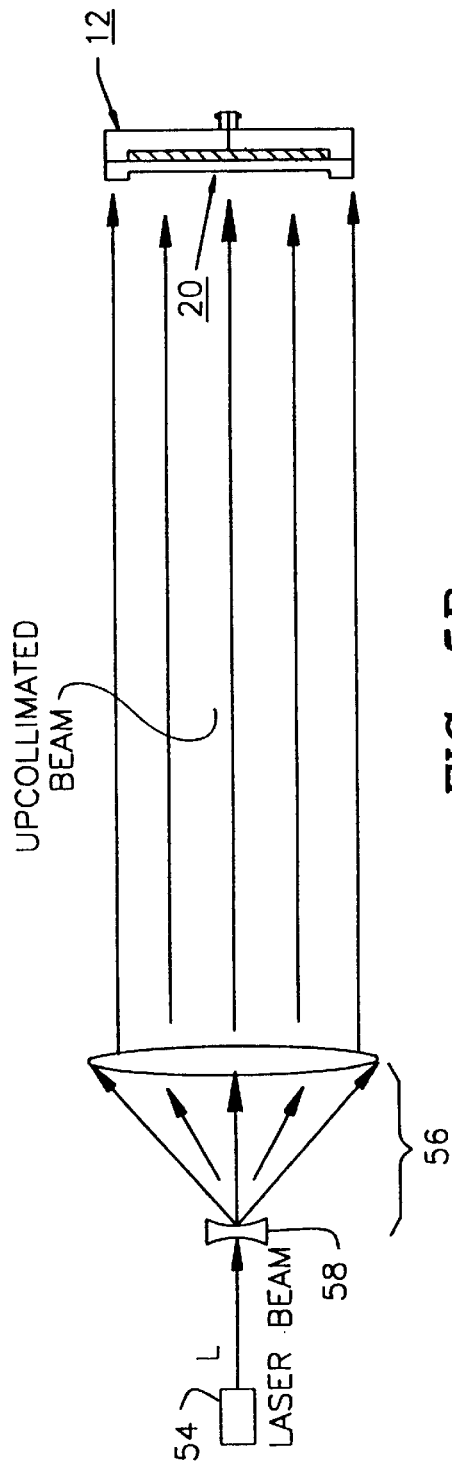
FIG. 5A
FIG. 5B

ULTRAFAST, HIGH VOLTAGE PULSER USING CIRCUMFERENTIALLY ILLUMINATED, LASER-SWITCHED RADIAL TRANSMISSION LINE

STATEMENT OF GOVERNMENT INTEREST

The invention described herein may be manufactured, used, and licensed by or for the Government of the United States of America without the payment to the inventors of any royalty thereon.

BACKGROUND OF THE INVENTION

1. Field of the Invention

The invention relates generally to electrical pulse signal generators and more specifically to a subnanosecond, kilovolt electrical pulse signal generator for electro-optical, pulse power, semiconductor, optoelectric, ultrafast electronic and ultra-wideband devices.

2. Description of the Prior Art

The prior art describes the use of laser-activated photoconductive switches for generating ultrafast high voltage electrical pulse signals. In particular, the prior art describes the compression of electrical pulses in a radial transmission line used in accelerators. In such accelerators, an electrical pulse is switched onto the circumference of a radial transmission line and experiences a gain as it propagates toward the center of the transmission line.

The prior art further describes the radial compression of photoconductively-switched picosecond electrical pulses in a circumferentially illuminated laser-driven accelerator. Such accelerators produce a voltage pulse at the center of the accelerator disc measuring a picosecond-timescale pulsewidth and a peak voltage approximately 2 times the applied DC bias. In such accelerators, the radial transmission line operates as a voltage multiplier to provide a voltage gain over the applied DC bias. Accordingly, the voltage pulse produced at the center of the accelerator disc provides a high-gradient electric field to accelerate electrons.

The high electric field produced at the center of the accelerator disc provides a valuable source of electrical pulses characterized by a peak voltage greater than the applied DC bias and a subnanosecond pulsewidth, for electro-optical, pulse power, semiconductor, optoelectronic, ultrafast electronic and ultrawideband devices, if the electric field could be tapped. Such an attempt was made in U.S. Pat. No. 5,155,352 issued to Kim et al. on Oct. 13, 1992, and entitled OPTICALLY ACTIVATED SUBNANOSECOND HYBRID PULSER. In U.S. Pat. No. 5,155,352, there is disclosed an electrical pulse signal generator which utilizes a centrally illuminated radial transmission line to produce a nanosecond, kilovolt electrical pulse signal.

There remains a need, however, for an improved electrical pulse signal generator which is capable of producing even higher gains and shorter pulses than the conventional electrical pulse signal generator devices described above.

SUMMARY OF THE INVENTION

In accordance with the present invention, there is provided a pulse signal generator apparatus. The apparatus comprises transformer means for storing electrical energy, the transformer means having a circular plate structure which can be coupled to a voltage source. A light activated switching means which becomes conductive upon the application thereto of a predetermined type of light energy, is disposed along a surface surrounding the circular plate structure for switching an input electrical pulse of a predetermined peak voltage, injected at a circumferential edge of the circular plate structure onto a peripheral surface of the circular plate structure to produce an output electrical pulse having a substantially higher peak voltage than the predetermined peak voltage of the input electrical pulse, at a center of the circular plate structure of the transformer means.

The apparatus can also include laser means for producing the predetermined type of light energy which illuminates the light activated switching means disposed along the surface surrounding the circular plate structure.

BRIEF DESCRIPTION OF THE DRAWINGS

A more complete understanding of the invention may be obtained from consideration of the following detailed description in conjunction with the accompanying drawings in which:

FIG. 5A schematically depicts preferred method for producing an annulus of light with a radius equal to $R_o$ which illuminates the RTLT photoconductive switch of the invention;

FIG. 5B schematically depicts an alternative method for illuminating the RTLT photoconductive switch of the invention.

DETAILED DESCRIPTION OF THE INVENTION

Figure 1:
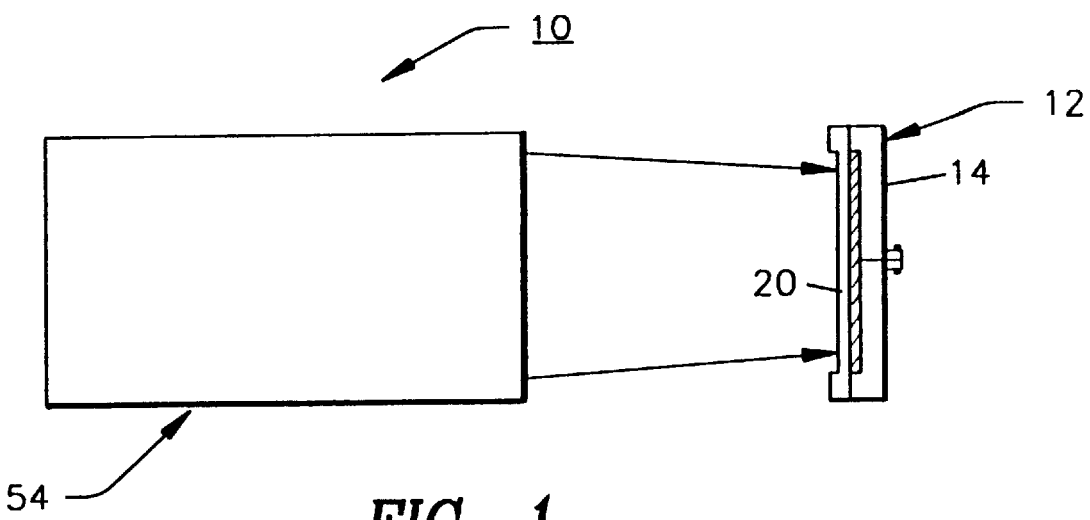
FIG. 1 schematically depicts a circumferentially illuminated, laser-switched radial transmission line transformer according to the invention.

Referring to FIG. 1, a circumferentially illuminated, laser-switched radial transmission line transformer (herein referred to as pulse apparatus) according to the invention is schematically shown and denoted by the numeral 10. The pulse apparatus 10 generally comprises two components: a radial transmission line transformer (RTLT) photoconductive switch or pulser 12 and a laser 54 for optically triggering the RTLT photoconductive switch 12. The RTLT photoconductive switch or pulser 12 includes a radial transmission line transformer (RTLT) 14 and a laser-activated photoconductive circumferential switch 20.

Figure 2A:
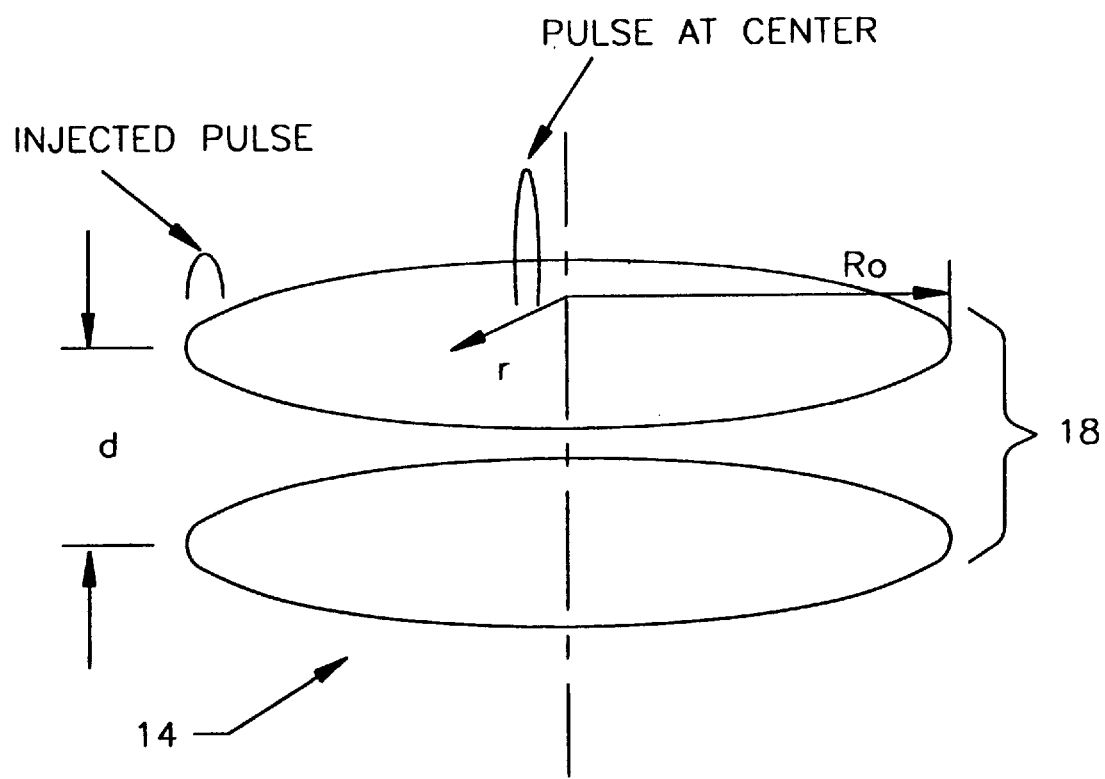
FIG. 2A schematically depicts the radial transmission line transformer of the invention.
Figure 2B:
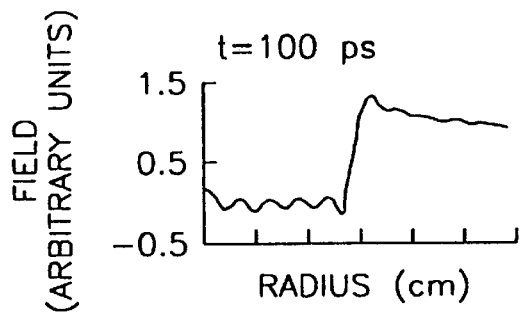
FIGS. 2B–2F are graphs plotting the electric field versus radius inside a RTLT having a disc structure with a 6 cm radius, for various times using the exact analytical solution given by Eq. (3) for the step function input injected at circumference r=6 at time t=0.
Figure 2C:
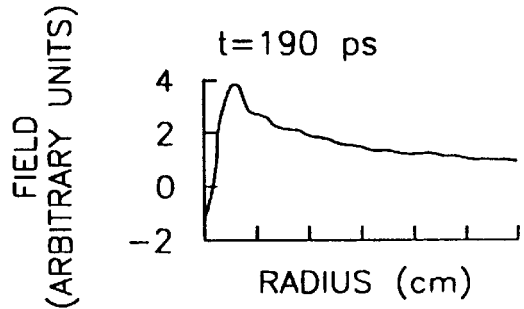
Figure 2D:
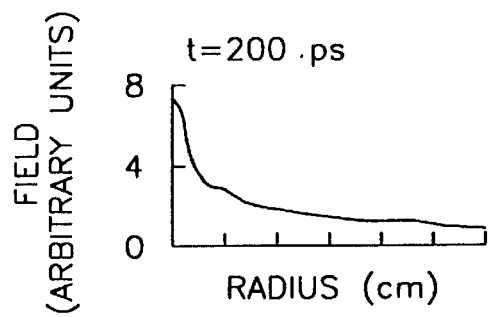
Figure 2E:
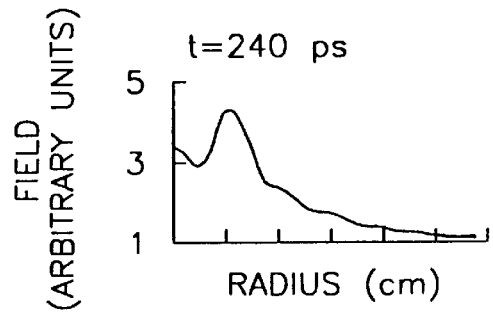
Figure 2F:
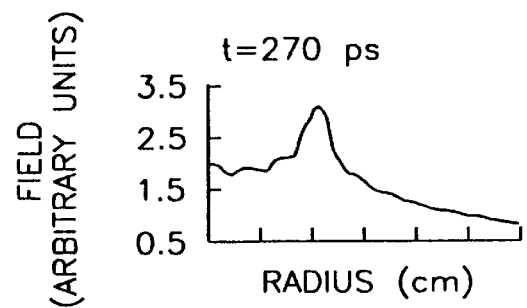
Figure 2G:
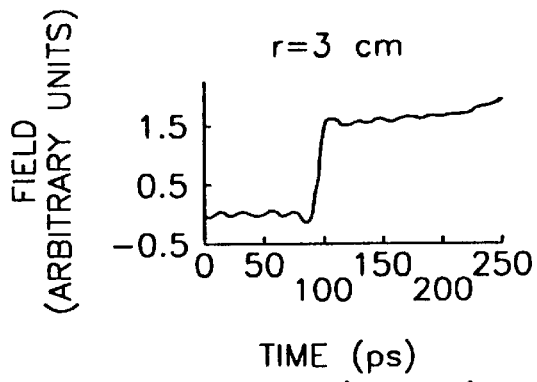
FIGS. 2G–2K are graphs plotting the electric field versus time for disc structure of various positions along the radii of a disc structure with a 6 cm radius, using the exact analytical solution given by Eq. (3) for the step function input injected at circumference r=6 at time t=0.
Figure 2H:
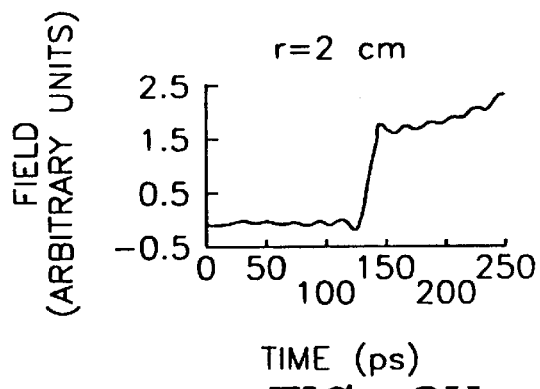
Figure 2I:
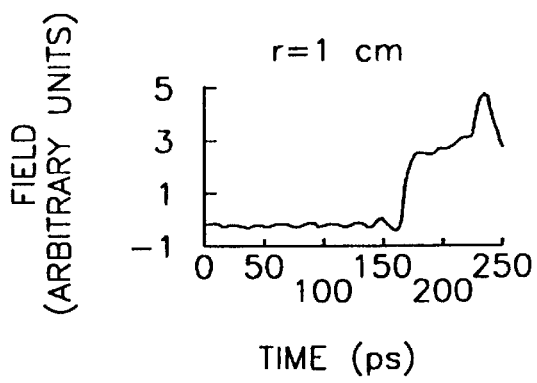
Figure 2J:
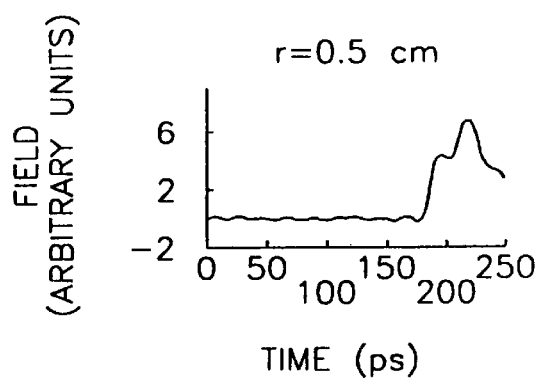
Figure 2K:
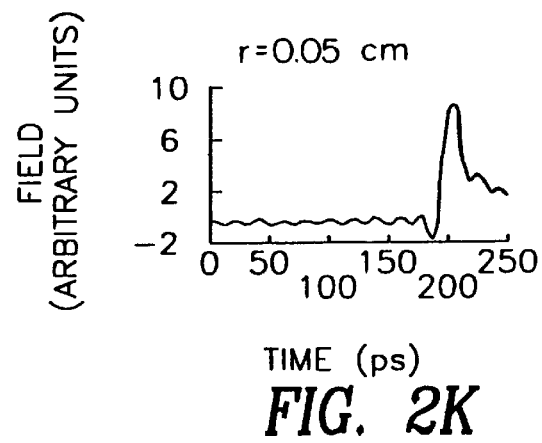
Figure 2L:
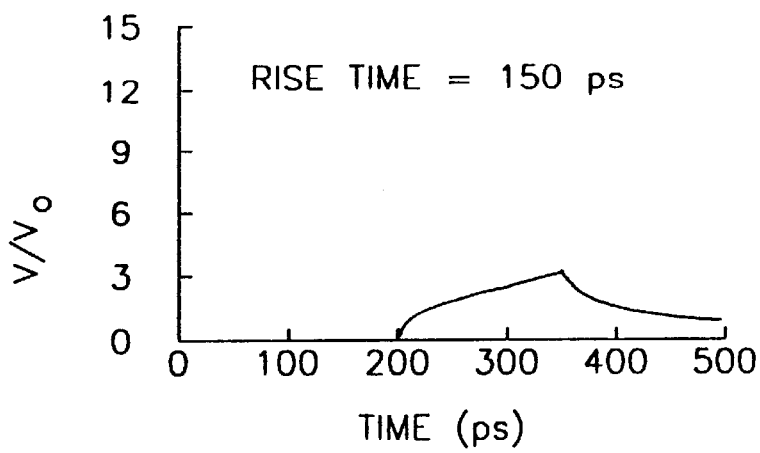
FIGS. 2L–2P are graphs plotting voltage ratio $V/V_o$ inside a 6 cm radius RTLT versus time for various input risetimes calculated numerically for finite risetime input with magnitude $V_o$ injected at circumference r=6 at time t=0.
Figure 2M:
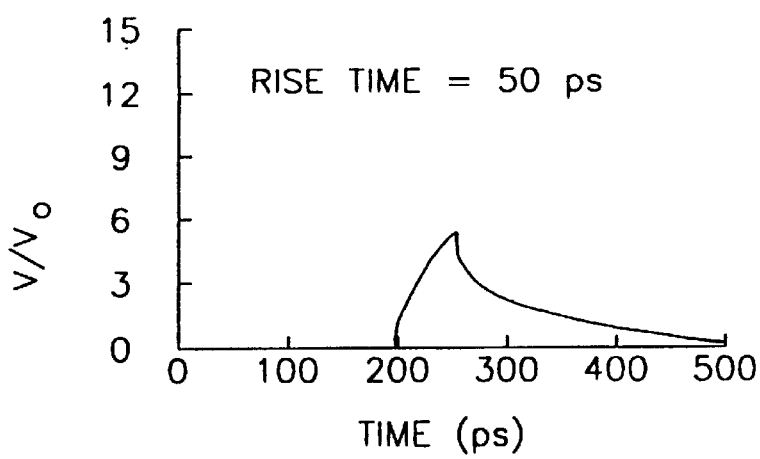
Figure 2N:
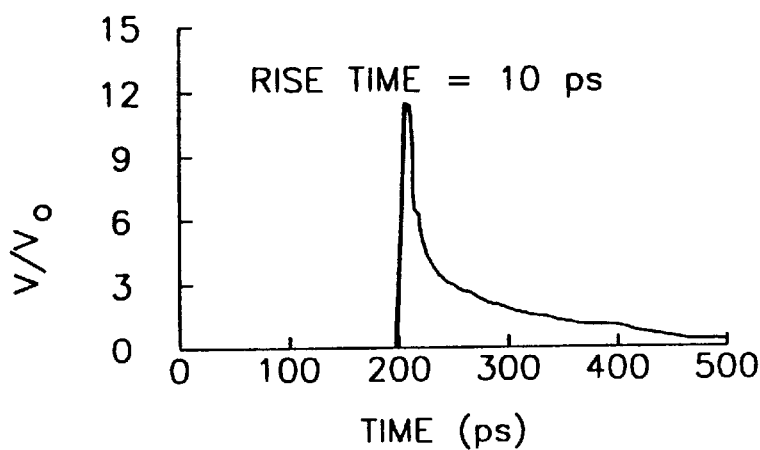
Figure 2O:
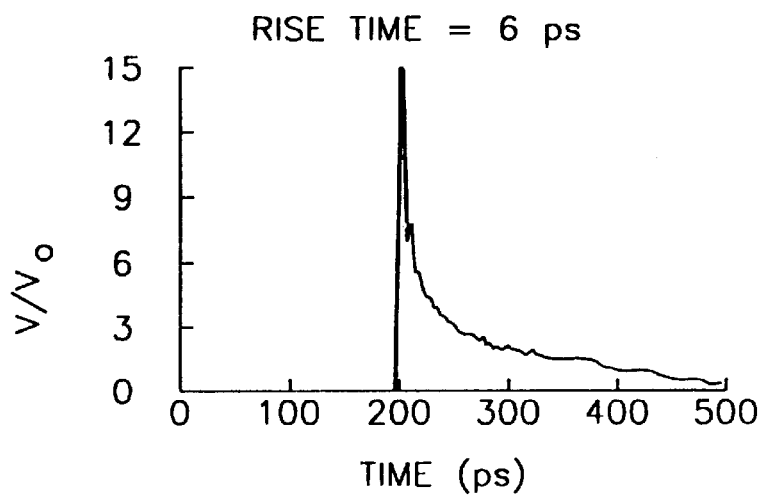
Figure 2P:
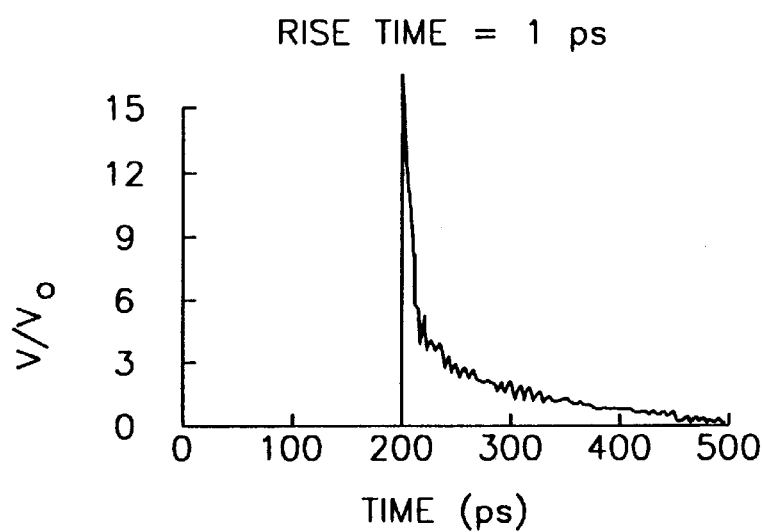

The RTLT 14 of the pulser 12 is depicted schematically in FIG. 2A. The RTLT 14 consists of a parallel plate capacitor comprised of two circular plates or disc structure 18 having a radius $R_o$ dielectrically separated by a distance d. In a DC circuit or in the steady state mode of operation, the RTLT 14 operates only as straight-forward capacitor. In the present invention, however, it is the transient properties of the RTLT 14 which are of interest.

Accordingly, if a short electrical pulse P of peak voltage $V_o$ (pulse risetime less than the radius pulse transit time of the RTLT 14) is injected at the circumferential edge of the disc structure 18, at radius $r=R_o$, the pulse P will propagate toward the center of the disc structure 18, at $r=0$. The impedance presented to the pulse P will vary depending on the radial position, r, of the pulse P in the RTLT 14 according to the relation:

$$Z(r) = \frac{377}{\sqrt{\epsilon_r}} \Omega \frac{d}{2 \Pi r} \tag{1}$$

The peak voltage, $V(r)$, at any radius, r, in the RTLT 14 will be related to the voltage at the circumferential edge, $V(R_o)$, by the relation:

$$\frac{V(r)}{V(R_o)} = \sqrt{\frac{Z(r)}{Z(R_o)}} = \sqrt{\frac{R_o}{r}} \tag{2}$$

The ratio $V(r)/V(RO)$ is the gain, G, of the RTLT 14. This is demonstrated by considering that the disc structure 18 of the RTLT 14 has an outer radius $R_o=3.0$ cm. If a pulse of peak voltage $V_o$ is injected at the circumferential edge of the disc structure 18, the peak voltage at a radius $r_{out}=0.05$ cm (½mm) is $\sqrt{3.0/0.05}V_o=\sqrt{60.0}V_o>>7.75\ V_o$. So, if a pulse of peak voltage $V_o$ is injected into the RTLT 14 at $R_o=3.0$ cm and extracted from the RTLT 14 at $r_{out}=0.05$ cm, the peak voltage of the extracted pulse will be greater than the injected pulse by a gain factor $G=7.75$.

This calculation of the gain G using the impedance formula, Eq. (2), can be compared to a more complete analytical or numerical calculation of the propagation of an electromagnetic pulse in the RTLT 14. The exact analytical solution for the electric field inside the RTLT 14, $E(r,t)$, which is a function of radius, r, and time, t, for a unity step-function voltage injected uniformly at the circumferential edge of an initally grounded RTLT 14 is given by the following relation:

$$E(r,t) = 1 - 2 \sum_{n=1}^{\infty} \frac{J_o\left(\frac{x_n^r}{R_o}\right) \cos\left(\frac{x_n^{ct}}{R_o}\right)}{x_n J_1(x_n)} \tag{3}$$

where $J_o(x)$ and $J_1(x)$ are the Bessel functions of zero and first order, respectively, and the set $\{x_n\}$ are solutions of $J_o(x)=0$. Note that this is for a step function input at radius $R_o$ which corresponds physically to instantaneously switching voltage onto the circumferential edge of the disc structure 18. These analytical results are shown in FIGS. 2B–2F and 2G–2K.

In FIGS. 2B–2F, the electric field versus radius inside a RTLT 14 having a disc structure 18 with a 6 cm radius, is plotted for various times using the exact analytical solution given by Eq. (3) for the step function input injected at circumference r=6 at time t=0. As can be seen, the field propagates inward from the 6 cm. outer radius or circumferential edge of the disc structure 18 of the RTLT 14 towards the center at r=O, reflects off the impedance pole at the center of the disc structure 18, and propagates back outward. Note that the electric field at the center of the disc structure 18 is 8 times the input field of unity at t=200 picoseconds.

In FIGS. 2G–2K, the electric field is plotted versus time for disc structure 18 of various radii. Note that as the radius of the disc structure 18 decreases (getting closer to the center of the RTLT 14) the peak field increases, so that at r=0.05 cm the field is ~11 times the input field of unity. For t>200 picoseconds reflections from the center of the RTLT 14 can be seen.

As is well known, any real switch will have some finite closing time and the switched voltage will appear on the circumferential edge of the disc structure 18 with some finite risetime. To calculate the electric field inside the disc structure 18 for an edge voltage with finite risetime, numerical techniques must be employed. A computer-aided numerical solution of the field equations inside the disc structure 18 was performed for a disc structure 18 having an outer radius $R_o=6.0$ cm for various switched voltage risetimes. The results are shown in FIGS. 2L–2P, where the ratio of the voltage, V, to the peak switched voltage at the peripheral surface, $V_o$, is plotted versus time for the radius r=0.05 cm (a typical point to extract the electrical pulse). The ratio $V/V_o$ is the gain of the RTLT. The voltage on the circumferential edge is switched on at t=0, and no signal is seen until t>>200 ps, the time it takes the voltage wave to propagate to the radius r=0.05 cm. It is evident that the gain is heavily dependent on the risetime of the voltage on the peripheral surface of the device. For a risetime of 1.0 picosecond ($10^{-12}$ sec), the gain is ~17, which is higher than the gain predicted from the simple impedance transformation, $\sqrt{6.0/0.05}\approx11$. Note that the gain decreases significantly when the risetime increases, down to ~3 for a risetime of 150 picoseconds. For longer risetimes, no appreciable gain is realized. This can be understood heuristically if one notes that the electromagnetic wave propagation time for the 6.0 cm device is ~200 ps. As the risetime of the injected voltage wave approaches the transit time, the RTLT 14 behaves more and more like a DC capacitor. The voltage at the circumferential edge of the disc structure 18 of the RTLT 14 must switch onto the peripheral surface thereof with a risetime less than the transit time of the RTLT 14 to achieve gain. Accordingly, the switch 20 employed in the RTLT photoconductive switch 12 is used at the peripheral surface of the RTLT 14 as will be later explained. The RTLT 14 will scale, so that larger RTLTs can tolerate longer risetimes. For example, a RTLT 14 with a disc structure 18 having a radius $R_o=1$ ft. could produce gain for switched voltage risetimes of ~1 nanosecond. It must be pointed out here that even 1 nanosecond is a fast timescale for conventional electronic devices, indicating that to realize gain with a RTLT 14 of compact size, an ultrafast switch must be employed in the RTLT 14.

The circumferential switch 20 used on the peripheral surface of the RTLT 14 must handle high voltage and be capable of closing on a picosecond timescale. It is preferred in the invention to use a laser activated-semiconductor photoconductive switch 20. Such picosecond photoconductive switches are well known in the art and, therefore, will be described only briefly below.

Figure 3A:
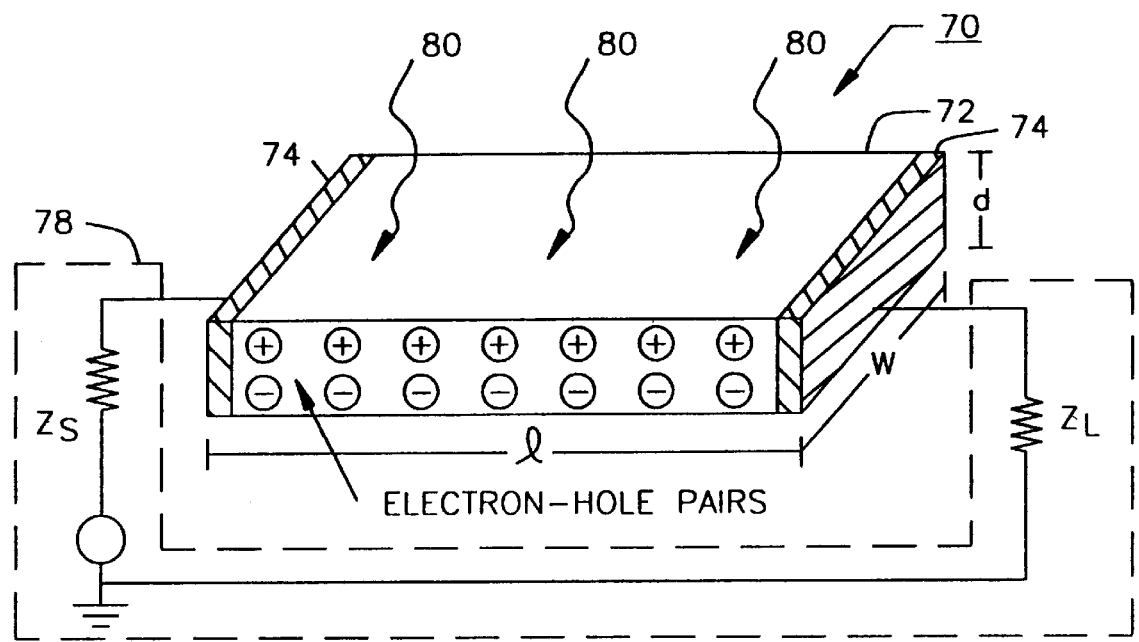
FIG. 3A schematically depicts a well known laser activated-semiconductor photoconductive switch connected to a circuit.

Referring to FIG. 3A, a well known laser activated-semiconductor photoconductive switch 70 is schematically shown connected to a circuit 78. The switch 70 is comprised of a high-resistivity semiconductor substrate 72 (typically Si or GaAs) with metallic contacts 74 on opposing sides of the substrate 72 which connect the switch 70 to a circuit 78. The conductance between the metallic contacts 74 on the semiconductor substrate 72 is modulated by the absorption of optical radiation 80 in the gap between the contacts 74. The optical radiation or light 80 creates mobile electron-hole pairs which are free to carry current under the influence of a bias voltage applied to the contacts 74. Before illumination, the switch 70 is "off", i.e., the gap conductance is extremely low due to the high material resistivity. After illumination, the switch 70 is "on", the gap becomes conductive and current can flow between the contacts 74. If a short-pulse laser is used to excite the photoconductive switch 70, the transition from the off to the on state, or switch risetime, will be quite sharp, essentially equal to the laser pulse width. Picosecond switching using Si has been described as early as 1975 in an article by D. H. Auston, entitled PICOSECOND OPTOELECTRONIC SWITCHING AND GATING IN SILICON, which was published in *Appl. Phys. Lett.* 26, pages 101–103. Thus, lasers with picosecond, or even femtosecond, pulse widths are commercially available, making ultrafast voltage switching possible. The high off-state resistance of switches made with high-resistivity GaAs material (~MW–GW) and high bulk breakdown electric field (~100 kV/cm) makes them particularly suitable for high voltage applications. An example of such a GaAs photoconductive switch is described in detail in U.S. Pat. No. 5,028,971, issued to Kim et al. on Jul. 2, 1991 and entitled HIGH POWER PHOTOCONDUCTOR BULK GaAs SWITCH.

Figure 3B:
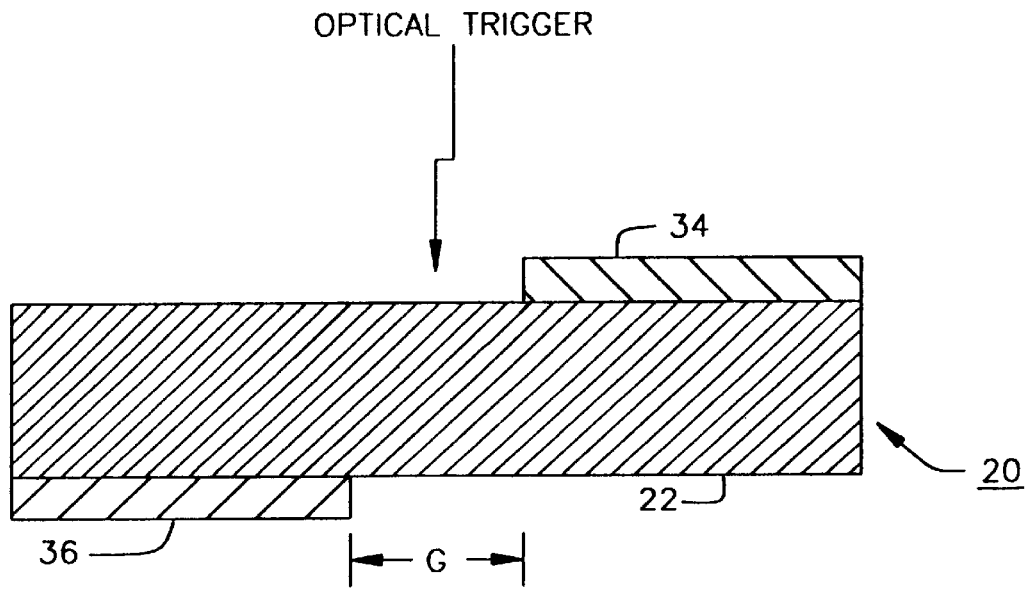
FIG. 3B schematically depicts the geometry of the laser activated-semiconductor photoconductive switch used in the RTLT photoconductive switch of the invention.

FIG. 3B schematically depicts the geometry of the laser activated-semiconductor photoconductive switch used in the RTLT photoconductive switch 12 of the invention. The switch 20 includes switch contacts or electrodes 24 which are disposed on opposite sides of a Si or GaAs semiconductor substrate 22. The electrodes 24 are offset from each other so that the electrodes 24 are not directly opposite each other and there is a horizontal gap G between electrodes 24. This substantially increases voltage hold-off capability of the switch 20. The metal electrodes 24 are conventionally applied to the semiconductor substrate 22 using well known vapor deposition techniques.

Figure 4:
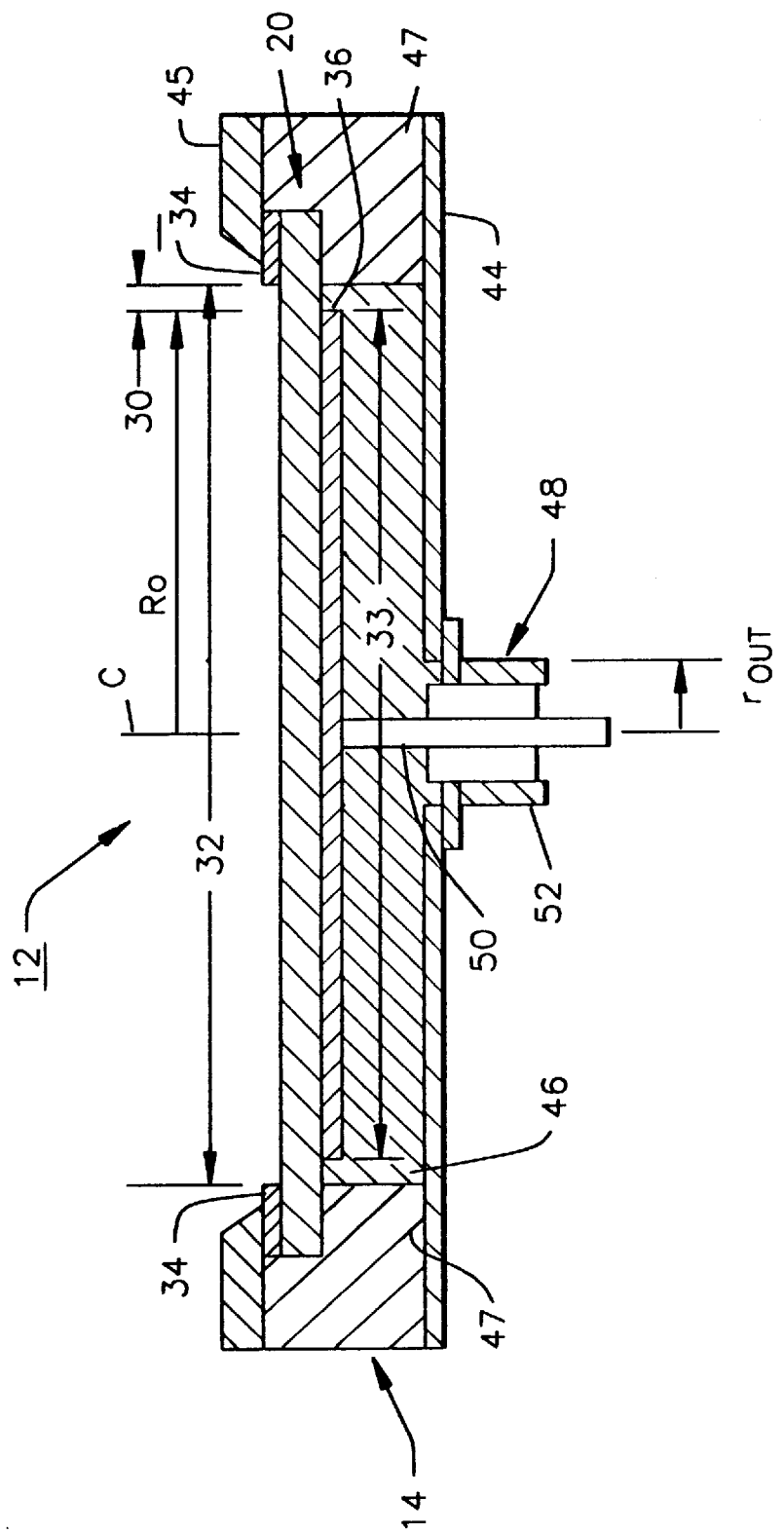
FIG. 4 depicts a cross-sectional side view of an exemplary embodiment of the RTLT photoconductive switch or pulser of the invention.

Referring to the cross-sectional side view of FIG. 4, an exemplary embodiment of the RTLT photoconductive switch or pulser 12 of the invention is shown. As can be seen, the pulser 12, is rotationally symmetric about its centerline C. The silicon semiconductor substrate 22 described above in FIG. 3B, is used as both the laser-activated circumferential switch 20 and as a substrate for a metal layer which forms one of the two circular plates of a RTLT 14. It is preferred that the silicon semiconductor substrate 22 comprise a 3" Si wafer because of its compact size and availability. It should be understood, however, that any other size wafer can be used if such sizes are available. An annular-shaped metal layer 34 deposited on the top side (as viewed in FIG. 4) of the Si substrate 22 forms one electrode of the photoconductive switch 20. A disc-shaped metal layer 36 is deposited on the bottom side of the Si substrate 22 and forms the other electrode of the photoconductive switch 20. This arrangement defines a gap 30 between the inner diameter 32 of the electrode 34 and the outer diameter 33 of the electrode 36 as per the offsetting geometry described earlier in FIG. 3B, and thus, the working portion of the photoconductive switch 20 extends circumferentially between the electrodes 34 and 36 of the Si substrate 22 at gap 30. The metal layer 36 on the bottom side of the Si substrate 22 also operates as one of the plates of a RTLT 14. The other plate of the RTLT 14 is provided by a machined metal outer member 44 which is kept separated from both the metal layer 36 of the Si substrate 22 and a substrate retaining ring 45, by a dielectric, circular-shaped spacer 46 made from TEFLON on the like. The spacer 46 in conjunction with a second annular-shaped spacer 47 (also made from TEFLON or the like) also serves to provide structural integrity to the pulser 12 by mechanically connecting the top and bottom plates 36 and 44 of the RTLT 14. The outer case member 44 (or bottom metal plate) is electrically grounded. The pulser 12 also includes a bulkhead coaxial connector 48 which serves as an output for the pulser 12. The connector 48 includes a center conductor 50 which provides an electrical connection to the center of the top plate 36 of the RTLT 14. The connector further includes a ground shield 52 which provides an electrical connection to the bottom metal plate 44 of the RTLT 14. Accordingly, if an electrical pulse is photoconductively switched into the RTLT 14 structure at the circumferential edge thereof adjacent the gap 30, the pulse can be extracted from the pulser 12 at the center of the RTLT 14 with the coaxial connector 48. It is necessary to match the impedance of the output connector 48 with the RTLT 14 to extract the pulse efficiently. While in general any impedance connector is possible, a standard 50 W BNC style bulkhead connector is preferred. The typical value of $r_o$ for a commercial BNC 50 Ω bulkhead connector is 0.5 cm. Using Eq. (1), the impedance matching condition, with $e_r=1$ is:

$$50\Omega = 377\Omega \frac{d}{2\pi r_{out}} = 377\Omega \frac{d}{2\pi(0.5 \text{ cm})} \qquad (4)$$

This can be solved for the plate spacing d, yielding d 0.42 cm. While this is only an approximate impedance matching condition, it is a valid approach which can be adjusted during the actual fabrication of the pulser 12.

For the purposes of estimating the gain of the pulser 12 of FIG. 4, $r_{out}$ can be considered the extraction radius for the pulse. For the 3" Si wafer with ~¼ used for the upper electrode 36, $R_o=1.251">>3.2$ cm. The gain of this prototype can then be estimated as:

$$\sqrt{\frac{R_{out}}{r_o}} = \sqrt{\frac{3.2}{0.5}} \approx 2.5$$

The photoconductive circumferential switch 20 must be activated by a short-pulse laser. This requires the use of a laser light that uniformly illuminates the gap 30 between the electrodes 34 and 36. Hence, it is preferred that the laser light used also be in the form of a ring or annulus.

FIG. 5A shows a preferred method for producing an annulus of light with a radius equal to $R_o$. This method involves the use of a laser 54 which employs a Galilean telescope 56 consisting of a divergent lens 58 and a subsequent convergent lens 60, that operates to expand or upcollimates a laser beam L produced by the laser 54. The upcollimated beam then passes through a toroidal lens 62 which converts the upcollimated beam into an annular-shaped light beam which impinges the gap 30 between the electrodes 34 and 36 (FIG. 4) to illuminate the circumferential switch 20. The torodial lens 62 is essentially a converging lens rotated about a line parallel the optic axis and tangent to the edge of the lens.

FIG. 5B shows an alternative method for uniformly illuminating the pulser 12. In this method, the toroidal lens 62 shown in FIG. 5A is not required, thus, the laser beam L produced by the laser 54 is only expanded by the Galilean telescope 56, as in FIG. 5B, to a beam radius of $R_o$, which impinges the gap 30 between the electrodes 34 and 36 (FIG. 4) to illuminate the circumferential switch 20. However, this method requires substantially greater laser energy as compared with the method of FIG. 5A, since much of the laser energy is not utilized because the upcollimated beam is not focused. The advantage of such a method is that it is considerably simpler to implement.

In any case, the laser 54 used must supply pulses shorter than the transit time of the RTLT 14, as discussed earlier. For the embodiment of FIG. 4, pulses on the order of 25 picoseconds would be appropriate to realize voltage gain in the structure. A mode-locked neodymium doped yttrium aluminum garnet (Nd:YAG) laser is the preferred laser 54 used in the invention, as such a laser has an operating wavelength of 1064 nanometers which provides excellent penetration into Si for exciting the bulk of the photoconductive switch 20. If shorter pulses are desired, well known laser pulse compression techniques such as those described in an article by B. H. Kolner et al. entitled COMPRESSION OF MODELOCKED Nd:Yag PULSES TO 1.8 ps, published in *Ultrafast Phenomena IV*, pp 19–22, can be employed to produce single picosecond pulses from a Nd:YAG laser system. Alternatively, a titanium doped sapphire (Ti:Sapphire) or short pulse organic dye Laser can be used.

Figure 5C:
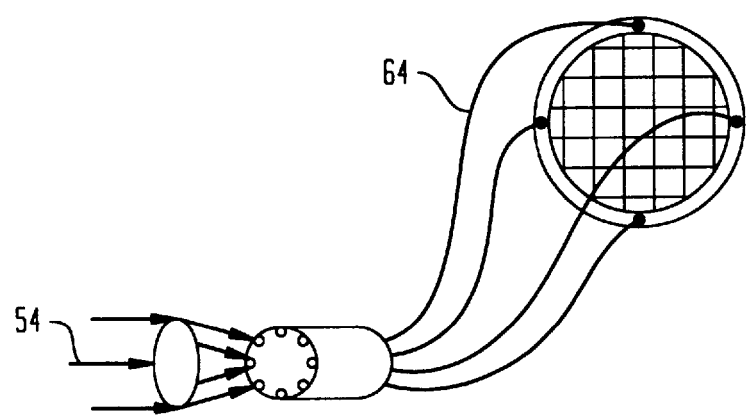
FIG. 5C schematically depicts another method for illuminating the RT:LT photoconductive switch of the invention.

FIG. 5C schematically depicts still another illumination scheme which employs a series of optical fibers 64 to deliver laser light L from a laser 54 such as described above to a number of discrete points along the circumference of the pulser 12. This method will not uniformly illuminate the pulser 12 but should produce a pulser which will realize gain if the number of optical fibers 64 is large. If such a lighting technique is implemented properly, it may provide the most practical illumination scheme.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A pulse signal generator apparatus comprising:
   transformer means for storing electrical energy, said transformer means having a circular plate structure which can be coupled to a voltage source; and
   light activated switching means which becomes conductive upon the application thereto of a predetermined type of light energy, said light activated switching means disposed along a surface surrounding said circular plate structure for switching an input electrical pulse of a predetermined peak voltage, injected at a circumferential edge of said circular plate structure onto a peripheral surface of said circular plate structure to produce an output electrical pulse having a substantially higher peak voltage than said predetermined peak voltage of said input electrical pulse, at a center of said circular plate structure of said transformer means.

2. The pulse signal generator apparatus according to claim 1, further comprising coaxial transmission line means coupled to said transformer means for coupling said output pulse produced at said center of said circular plate structure of said transformer means to a load.

3. The pulse signal generator apparatus according to claim 1, further comprising laser means for producing said predetermined type of light energy which illuminates said light activated switching means disposed along said surface surrounding said circular plate structure.

4. The pulse signal generator apparatus according to claim 3, wherein said laser means for producing said predetermined type of light energy includes light generation means for producing a beam of light and upcollimating means for converting saiLd beam of light produced by said light generation means into an upcollimated beam of light energy which uniformly illuminates said light activated switching means disposed along said surface surrounding said circular plate structure.

5. The pulse signal generator apparatus according to claim 4, wherein said laser means for producing said predetermined type of light energy further includes focusing lens means for focusing said upcollimated light beam into an annular-shaped light beam which uniformly illuminates said light activated switching means disposed along said surface. surrounding said circular plate structure.

6. The pulse signal generator apparatus according to claim 3, wherein said laser means for producing said predetermined type of light energy includes light generation means for producing a beam of light and means for delivering said beam of light to a predetermined number of discrete points along said light activated switching means disposed along said surface surrounding said circular plate structure.

7. The pulse signal generator apparatus according to claim 1, wherein said light activated switching means includes a semiconductor device having said surface surrounding said circular plate structure.

8. The pulse signal generator apparatus according to claim 7, wherein said semiconductor device is made from Si.

9. The pulse signal generator apparatus according to claim 7, wherein said semiconductor device is made from GaAs.

10. A pulse signal generator apparatus comprising:
    transformer means for storing electrical energy, said transformer means having a circular plate structure including a pair of circular-shaped plates separated by a dielectric medium which can be coupled to a voltage source; and
    light activated switching means which becomes conductive upon the application thereto of a predetermined type of light energy, said light activated switching means being disposed along a surface surrounding one of said pair of circular-shaped plates for switching an input electrical pulse of a predetermined peak voltage, injected at a circumferential edge of said circular plate structure onto a peripheral surface of said circular plate structure to produce an output electrical pulse having a substantially higher peak voltage than said predetermined peak voltage of said input electrical pulse, at a center of said circular plate structure of said transformer means.

11. The pulse signal generator apparatus according to claim 10, further comprising a coaxial transmission line having a first conductor coupled to a center of a first one of said pair of circular-shaped plates of said transformer means and a second conductor coupled to a second one of said pair of circular-shaped plates, said coaxial transmission line operating to couple said output pulse produced at said center of said circular plate structure of said transformer means to a load.

12. The pulse signal generator apparatus according to claim 10, further comprising a laser for producing a short pulse of said predetermined type of light energy which illuminates said light activated switching means disposed along said surface surrounding said one of said pair of circular-shaped plates.

13. The pulse signal generator apparatus according to claim 12, wherein said laser includes light generation means for producing a beam of light and upcollimating means for converting said beam of light produced by said light generation means into an upcollimated beam of light energy which uniformly illuminates said light activated switching means disposed along said surface surrounding said one of said pair of circular-shaped plates.

14. The pulse signal generator apparatus according to claim 13, wherein said laser further includes focusing lens means for focusing said upcollimated light beam into an annular-shaped light beam which uniformly illuminates said light activated switching means disposed along said surface surrounding said one of said pair of circular-shaped plates.

15. The pulse signal generator apparatus according to claim 12, wherein said laser includes light generation means for producing a beam of light and means for delivering said beam of light to a predetermined number of discrete points along said light activated switching means disposed along said surface surrounding said one of said pair of circular-shaped plates.

16. The pulse signal generator apparatus according to claim 10, wherein said light activated switching means includes a semiconductor device which includes said surface surrounding said one of said pair of circular-shaped plates.

17. The pulse signal generator apparatus according to claim 16, wherein said semiconductor device is made from Si.

18. The pulse signal generator apparatus according to claim 16, wherein said semiconductor device is made from GaAs.

19. The pulse signal generator apparatus according to claim 16, wherein said semiconductor device includes a semiconductor substrate having said surface which surrounds said one of said pair of circular-shaped plates, said one of said pair of circular-shaped plates also operating as an electrode of said light activated switching means.

20. The pulse signal generator apparatus according to claim 19, wherein said semiconductor substrate includes a second surface located opposite to said surface, said second surface having disposed thereon an annular-shaped electrode.

21. The pulse signal generator apparatus according to claim 20, wherein said annular-shaped electrode includes a predetermined inner diameter which is larger than an outer diameter defined by said one of said pair of circular-shaped plates operating as said electrode, so as to define a gap therebetween which is illuminated by the said predetermined type of light energy.

* * * * *